United States Patent [19]

Iwamatsu et al.

[11] 4,137,506

[45] Jan. 30, 1979

[54] COMPOUND TRANSISTOR CIRCUITRY

[75] Inventors: Masayuki Iwamatsu; Kenji Yokoyama, both of Hamamatsu, Japan

[73] Assignee: Nippon Gakki Seizo Kabushiki Kaisha, Hamamatsu, Japan

[21] Appl. No.: 846,021

[22] Filed: Oct. 27, 1977

[30] Foreign Application Priority Data

Nov. 11, 1976 [JP] Japan .......................... 51/151431[U]

[51] Int. Cl.$^2$ ............................................. H03F 3/04
[52] U.S. Cl. ........................................ 330/288; 323/4; 330/257; 330/260
[58] Field of Search .................... 307/313, 315; 323/4; 330/288, 257, 260

[56] References Cited

U.S. PATENT DOCUMENTS 3,714,600  1/1973  Kuiuk et al. ....................... 330/288

Primary Examiner—Lawrence J. Dahl
Attorney, Agent, or Firm—Cushman, Darby & Cushman

[57] ABSTRACT

A compound transistor all of the first conductivity type circuitry having a high input impedance as well as a high gain, comprises a first, a second and a third bipolar transistor, and a fourth bipolar transistor complementary to at least the first transistor, the second and third transistors having their emitters coupled together to a first terminal and having their bases connected together and further connected to the collector of the fourth transistor, the bases of the first and fourth transistors being connected in common to a second terminal, the emitter of the first transistor being connected to the collector of the second transistor, the collector of the first transistor and the emitter of the fourth transistor being connected together to a third terminal.

9 Claims, 4 Drawing Figures

COMPOUND TRANSISTOR CIRCUITRY

BACKGROUND OF THE INVENTION

1. Field of the invention

The present invention pertains to a compound transistor circuitry consisting of a combination of bipolar transistors, and more particularly to a compound transistor circuitry of bipolar transistors which requires no or neglible amount of input offset current for operation.

2. Description of the prior art

There has been desired a transistor having a high input impedance as well as a high gain, to make it possible to easily materialize an amplifier circuit of a simple arrangement which provides a high gain and a high input impedance. The existing transistors such as a bipolar transistor and a field effect transistor, however, cannot fully meet these requirements.

A bipolar transistor has a drawback that its input impedance is fairly low since it requires a considerable amount of input offset current for operation. In contrast thereto, a field effect transistor is superior to a bipolar transistor with respect to the input impedance requirement, but on the other hand, its possible gain is, in general, pretty poor as compared with a bipolar transistor.

SUMMARY OF THE INVENTION

It is, therefore, an object of the present invention to provide a compound transistor circuitry having a high input impedance as well as a high gain.

Another object of the present invention is to provide a compound transistor circuitry of the type described above, which includes only bipolar transistors.

Still another object of the present invention is to provide an amplifier circuit of a simple arrangement which provides both a high input impedance and a high gain.

These and other objects as well as the features of the present invention will become apparent by reading the following detailed description of the preferred embodiments when taken in conjunction with the accompanying drawings.

DETAILED DESCRIPTION OF THE PREFERRED EMBODIMENTS

Figure 1:
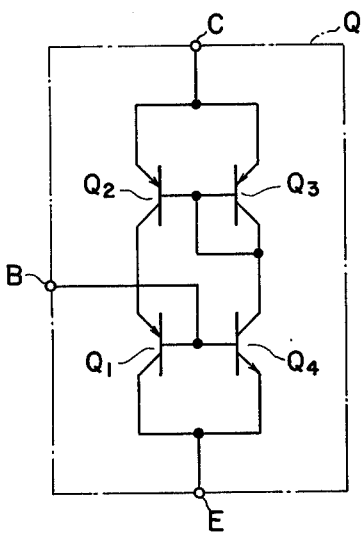
FIG. 1 is an electric circuit diagram showing an example of the compound transistor circuitry according to the present invention.

In FIG. 1 is shown an example of the compound transistor circuitry according to the present invention, which consists of bipolar transistors $Q_1$, $Q_2$ and $Q_3$ of pnp-type, and a bipolar transistor $Q_4$ of npn-type $Q_1$, which is complementary to at least the pnp-type. The emitters of the transistors $Q_2$ and $Q_3$ are coupled together to a terminal C and the bases thereof to the collector of the transistor $Q_3$, respectively. The collector of the transistor $Q_2$ is coupled to the emitter of the transistor $Q_1$, and the collector of the transistor $Q_3$ is coupled to the collector of the transistor $Q_4$. The co-coupled bases of both transistors $Q_1$ and $Q_4$ are connected to a terminal B, and the collector of the transistor $Q_1$ and the emitter of the transistor $Q_4$ are connected to a terminal E. The operation of this compound transistor circuitry Q according to the present invention will be explained with respect to the amplifier of FIG. 2.

Figure 2:
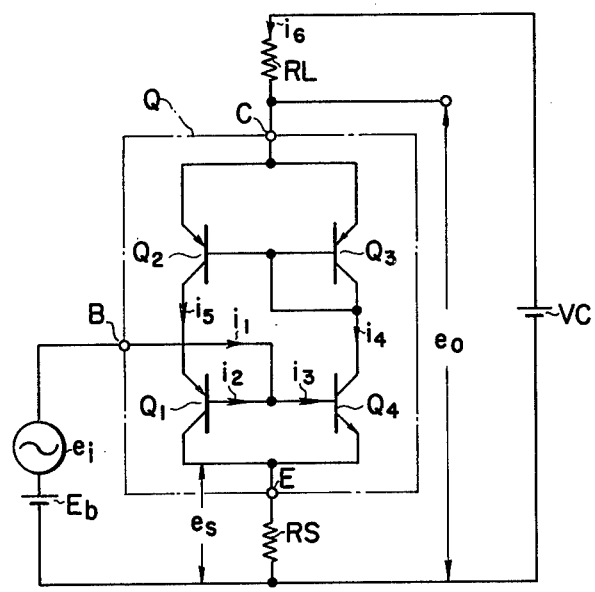
FIG. 2 is an electric circuit diagram showing a basic amplifier circuit employing the compound transistor circuitry of FIG. 1.

FIG. 2 shows a basic amplifier circuit employing the compound transistor circuitry shown in FIG. 1 to serve as its amplifier element. A terminal C is connected to the positive side of a dc voltage supply source VC through a load resistor RL, and the terminal E is connected through a resistor RS to the negative side of the voltage supply source VC. A signal source $e_i$ is coupled between the terminal B and the negative side of the voltage supply source VC via a biasing voltage source $E_b$.

From Kirchhoff's First Law, the current $i_1$ flowing through the terminal B is given by:

$$i_1 = i_3 - i_2 \qquad \text{Eq. (1)}$$

where $i_2$ and $i_3$ are the base currents of the transistors $Q_1$ and $Q_4$. If both transistors $Q_1$ and $Q_4$ have the same current amplifying factor $h_{fe1}$ (common-emitter static forward current transfer ratio), both transistors $Q_2$ and $Q_3$ also have the same current amplifying factor $h_{fe2}$, and this latter factor $h_{fe2}$ is so large that the base currents of the transistors $Q_2$ and $Q_3$ may be negligible as compared with the collector currents of these two transistors. Therefore, there are obtained the following relation:

$$i_4 = i_5 \qquad \text{Eq. (2)}$$

$$i_2 = i_3 \qquad \text{Eq. (3)}$$

where the respective currents $i_4$ and $i_5$ are illustrated in FIG. 2. Thus, in this case, the input current $i_1$ is zero. Accordingly, the input impedance $R_i$ will be as follows:

$$R_i = e_i/i_1 = \infty \qquad \text{Eq. (4)}$$

The voltage gain $A_v$ of the amplifier circuit is expressed by:

$$A_v = i_6 \cdot RL/i_3 \cdot h_{ie1} + e_s \qquad \text{Eq. (5)}$$

where $e_s$ is the voltage drop developed across the resistor RS, and $h_{ie1}$ is the common-emitter small-signal short-circuit input impedance of the transistor $Q_1$ or $Q_4$. Substituting the relationship $h_{ie1} \approx r_e \cdot h_{fe1}$ for Eq. (5), there will be given $$A_v = \frac{i_6 \cdot RL}{\frac{i_6}{2h_{fe1}} \cdot r_e \cdot h_{fe1} + i_6 \cdot RS} \qquad \text{Eq. (6)}$$

$$= \frac{RL}{r_e/2 + RS}$$

where $r_e$ is the internal emitter resistance of the transistor $Q_1$ or $Q_4$. From Eq. (6), the transconductance $g_m$ of the amplifier circuit of FIG. 2 will become as follows:

$$g_m = 1/r_e/2 + RS \qquad \text{Eq. (7)}$$

Eq. (7) shows the fact that the compound transistor circuitry Q according to the present invention has a high transconductance or gain comparing to that of a bipolar transistor.

Figure 3:
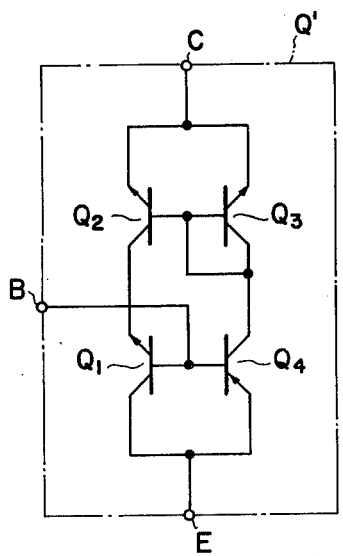
FIG. 3 is an electric circuit diagram showing another example of the compound transistor circuitry according to the present invention.

Another example Q' of the compound transistor circuitry according to the present invention is illustrated in FIG. 3. This embodiment is different from the preceding embodiment shown in FIG. 1 only in that the transistors $Q_1$, $Q_2$ and $Q_3$ are replaced by bipolar transistors of npn-type, and the transistor $Q_4$ is replaced by a bipolar transistor of pnp-type.

Figure 4:
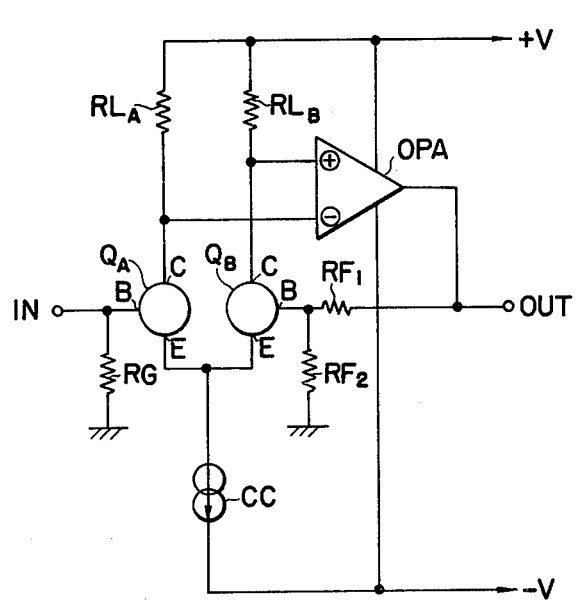
FIG. 4 is an electric circuit diagram showing an example of the amplifier circuit employing the compound transistor circuitry of FIG. 1.

A more practical example of the amplifier circuit using the compound transistor circuitry according to the present invention is shown in FIG. 4. The amplifier circuit is made with a first stage differential amplifier circuit including a pair of compound transistor circuitries $Q_A$ and $Q_B$ of the present invention as shown in FIG. 1, and a second stage circuit including an operational amplifier OPA. The respective terminals E of both compound transistor circuitries $Q_A$ and $Q_B$ are connected via a known common constant circuit CC to a negative side $-V$ of a dc voltage source, and the terminals C are respectively connected to a positive side $+V$ of the dc voltage source through respective load resistors RLA and RLB and to inverting and non-inverting input terminals of the operational amplifier OPA. The terminal B of the compound transistor circuitry $Q_A$ is connected to an signal input terminal IN of the amplifier circuit, and is either grounded or connected to the neutral point of the dc voltage source through a resistor $R_G$. The input signal is amplified through the first stage circuit and the operational amplifier OPA, then is delivered out at an output terminal OUT. The output signal is negative-fed back to the terminal B of the compound transistor circuitry $Q_B$ through a network of resistors $RF_1$ and $RF_2$.

As described above, according to the present invention, there can be provided a compound transistor circuitry having a high input impedance as well as a high gain, and accordingly it is possible to materialize a simple-structured amplifier having a high impedance and a high gain.

What is claimed is:

1. A compound transistor circuit comprising:
    a first, a second and a third terminal,
    first, second and third bipolar transistors of a first conductivity type, and
    a fourth bipolar transistor complementary at least to said first transistor,
    said second and third transistors having their respective emitters coupled together to said first terminal,
    a base of said second transistor and a collector of said third transistor being connected together to a collector of said fourth transistor, a base of said third transistor being connected to the collector of said third transistor, bases of said first and fourth transistors being connected in common to said second terminal, an emitter of said first transistor being connected to a collector of said second transistor, a collector of said first transistor and an emitter of said fourth transistor being connected together to said third terminal.

2. A compound transistor circuitry according to claim 1, wherein: said first, second and third transistors are pnp-type bipolar transistors and said fourth transistor is an npn-type bipolar transistor.

3. A compound transistor circuitry according to claim 1, wherein: said first, second and third transistor are npn-type bipolar transistors and said fourth transistor is a pnp-type bipolar transistor.

4. An amplifier circuit comprising:
    a compound transistor circuit including first, second and third bipolar transistors of a first conductivity type, and a fourth bipolar transistor complementary at least to said first transistor,
    said second and third transistors having their respective emitters coupled together to a first terminal, a base of said second transistor and a collector of said third transistor being connected together to a collector of said fourth transistor,
    a base of said third transistor being connected to the collector of the third transistor,
    bases of said first and fourth transistors being connected in common to a second terminal,
    an emitter to said first transistor being connected to a collector of said second transistor,
    a collector of said first transistor and an emitter of said fourth transistor being connected together to a third terminal,
    a dc voltage source connected beween first and third terminals,
    a resistor connected in series between said first terminal and one side of said dc voltage source,
    an input signal source being connectible to said second terminal; and
    an output signal of said amplifier circuit being delivered at said first terminal.

5. An amplifier circuit according to claim 4, further comprising: another resistor connected in series between said third treminal and the other side of said dc voltage source.

6. An amplifier circuit according to claim 4, wherein: said first, second and third transistors are pnp-type bipolar transistors, said fourth transistor is an npn-type bipolar transistor, said one side of said dc voltage source constitutes the positive side and said other side of said dc voltage source constitutes the negative side.

7. An amplifier circuit comprising:
    a first stage for amplifying an input signal and a second stage for amplifying the output signal of the first stage,
    said first stage including: a first and a second compound transistor circuit each comprising: first, second and third bipolar transistors of a first conductivity type and a fourth bipolar transistor complementary at least to said first transistor,
    said second and third transistors having their respective emitters coupled together to a first terminal, a base of said second transistor and a collector of said third transistor being connected together to a collector of said fourth transistor,
    a base of said third transistor being connected to the collector of the third transistor,
    bases of said first and fourth transistors being connected in common to a second terminal,
    an emitter of said first transistor being connected to a collector of said second transistor,
    a collector of said first transistor and an emitter of said fourth transistor being connected together to a third terminal,
    a dc voltage source,
    a constant current circuit,
    said third terminals of both said compound transistors being connected through said constant current circuit to one side of said dc voltage source; and
    a first and a second resistor,
    said first terminals of said first and second compound transistor circuits being connected to the other side of said dc voltage source through said first and second resistors, respectively, said input signal being applied to said second terminal of said first compound transistor circuit; and said output signal of said first stage being delivered out of said first terminals of both said compound transistor circuits.

8. An amplifier circuit according to claim 7, wherein: said first, second and third transistors are pnp-type bipolar transistors, said fourth transistor is an npn-type bipolar transistor, said one side of said dc voltage source constitutes the negative side and said other side of said dc voltage source constitutes the positive side.

9. An amplifier circuit according to claim 7, further comprising: a resistor network through which the output signal of said second stage is applied to said second terminal of said second compound transistor circuitry.

* * * * *